United States Patent [19]

Conary

[11] Patent Number: 5,570,050
[45] Date of Patent: Oct. 29, 1996

[54] ZERO STANDBY CURRENT POWER-UP RESET CIRCUIT

[75] Inventor: James Conary, Aloha, Oreg.

[73] Assignee: Intel Corporation, Santa Clara, Calif.

[21] Appl. No.: 590,726

[22] Filed: Jan. 24, 1996

Related U.S. Application Data

[63] Continuation of Ser. No. 209,106, Mar. 8, 1994, abandoned.

[51] Int. Cl.$^6$ .................................................. H03K 17/22
[52] U.S. Cl. ............................................ 327/143; 327/198
[58] Field of Search .................................. 327/143, 198, 327/545, 546

[56] References Cited

U.S. PATENT DOCUMENTS

| | | | |
|---|---|---|---|
| 4,419,596 | 12/1983 | Kikuchi | 327/143 |
| 4,818,904 | 4/1989 | Kobayashi | 327/143 |
| 4,900,950 | 2/1990 | Dubujet | 327/143 |
| 5,039,875 | 8/1991 | Chang | 327/143 |
| 5,115,146 | 5/1992 | McClure | 327/143 |
| 5,136,181 | 8/1992 | Yukawa | 327/143 |
| 5,151,614 | 9/1992 | Yamazaki et al. | 327/143 |
| 5,155,730 | 10/1992 | Maida | 327/198 |
| 5,172,012 | 12/1992 | Ueda | 327/143 |
| 5,177,375 | 1/1993 | Ogawa et al. | 327/143 |
| 5,245,330 | 9/1993 | Wassink | 340/825.34 |
| 5,374,923 | 12/1994 | Sakamoto | 327/143 |

FOREIGN PATENT DOCUMENTS 6-152358  5/1994  Japan .................................. 327/143

*Primary Examiner*—Terry Cunningham
*Attorney, Agent, or Firm*—Blakely, Sokoloff, Taylor & Zafman

[57] ABSTRACT

A circuit and method in a computer system for generating a power-up reset pulse is disclosed. A specially designed flip-flop and a voltage shifter create a signal that ramps-up with a rising voltage from a newly activated power supply until a desired voltage level is reached. The signal is then deasserted and, in one embodiment, the circuit is reset so that another reset signal can be generated should power be removed and then reapplied in a short period of time. This circuit is configured so that no DC current paths from power to ground exist within the circuit once the reset pulse generation is complete.

4 Claims, 5 Drawing Sheets

ZERO STANDBY CURRENT POWER-UP RESET CIRCUIT

This is a continuation of application Ser. No. 08/209,106, filed Mar. 8, 1994, now abandoned.

BACKGROUND OF THE INVENTION

1. Field of the Invention

This invention relates generally to the operation of integrated circuits. More particularly, it relates to the generation of a power-up reset pulse for ensuring the orderly power-up of an integrated circuit.

2. Background of the Invention

When a power supply is first activated, it asserts a voltage level that rises from zero volts to a voltage level required during normal operation, for example 3.3 volts. During this "power-up" period, an integrated circuit coupled to the power supply can behave in an unknown and unpredictable manner, possibly causing the integrated circuit to function improperly once the power-up is complete. There are various causes for this improper functioning, including residual voltage on certain nodes in the integrated circuit, and delays in the distribution of the power supply signal that cause voltage differentials on transistors and other devices within the circuit. One method for preventing these problems is the application of a power-up reset pulse during the power-up period to certain critical nodes and devices with the integrated circuit.

A power-up reset pulse preferably has a voltage level that starts at zero volts, rises linearly until a certain predetermined level is achieved, and then drops back down to zero volts. During the rising period, the voltage level of the power-up reset pulse should be as identical as possible to the rising voltage level asserted by the power supply. The reset pulse is applied to key nodes and devices throughout the integrated circuit being powered up so that the voltage level at these points is substantially predictable throughout the power-up period. Once power-up is complete, any circuitry used to generate the power-up reset pulse becomes inactive.

Previous power-up reset circuits for generating a power-up reset pulse utilized resistive and capacitive elements combined to create a desired ramp shape. These circuits have several shortcomings. The capacitive element normally requires a certain amount of time after the power supply is removed to discharge before another reset pulse can be generated. However, a typical method for resetting a computer or other system using integrated circuits is to turn the system off and then back on again quickly. Accordingly, the need to discharge the capacitor prior to reactivating the system creates a delay and inconvenience for the user. Additionally, the resistive element of previous power-up reset circuit continues to cause the circuit to drain DC current even after the circuit is no longer operating. With the advent to laptop computers which rely on batteries for power, and the emergence of an environmentally friendly computer market, the unnecessary current drain is another shortcoming. Furthermore, both resistive and capacitive elements in integrated circuits are extremely sensitive to process and temperature parameters. Accordingly, the voltage level at which the reset pulse falls to zero deassertion voltage of previous power-up reset circuits can vary considerably. It is generally desirable to maintain predictability within an integrated circuit, and any sensitivity to process and temperature parameters may affect the predictability of the integrated circuit.

BRIEF SUMMARY OF THE INVENTION

An integrated circuit that generates a power-up reset pulse in response to the rising voltage level of a power supply signal is disclosed. In a first embodiment, the circuit is comprised of an integrated circuit that powers-up in a known state and a voltage shifter. In a second embodiment, an additional integrated circuit that resets the system is included which allows a power-up reset pulse to be properly asserted even if the power supply signal is removed and then reapplied within a short interval of time. Each of the preferred embodiments incorporates active logic to create the power-up reset pulse so that the circuits leak substantially no DC current once the power-up cycle has been completed.

In the first preferred embodiment, a flip-flop configured to power-up in a known state is combined with a voltage shifter circuit. The flip-flop provides the source of the reset pulse. The voltage shifter causes a voltage drop between two nodes that delays the generation of a toggle signal until the power supply signal reaches a certain value. The toggle signal causes the flip-flop to toggle and because the flip-flop is used as the source of the reset pulse, terminates the power-up reset pulse. The power-up reset pulse then remains terminated and the circuitry used to generated the pulse remains inactive as long as the power supply signal remains above a certain voltage level.

In the second preferred embodiment a reset circuit is added. The reset circuit is coupled between the voltage shifter and the flip-flop. In this embodiment the toggle signal of the voltage shifter is received by the reset circuit. The reset circuit generates a reset signal when the toggle signal is detected. The reset signal terminates the power-up reset pulse and additionally causes any current on critical nodes within the flip-flop and the voltage shifter to be removed. Removing current from the critical nodes places the voltage shifter and the flip-flop in condition to generate a new power-up reset pulse even if power supply signal be removed and reapplied in a short period of time.

Additionally, in the second preferred embodiment, the flip-flop and the reset circuit are coupled in a second manner so that when the flip-flop is reset, a second reset signal is generated that is transmitted back to the reset circuit. The second reset signal causes excess current to be removed from certain nodes within the reset circuit so that the reset circuit will also be ready to generate another power-up reset pulse should the power supply signal be removed and reasserted in a short period of time. The flip-flop and the reset circuit then form a feedback loop that keeps the flip-flop and reset circuit in the reset state until the power supply is removed.

The power-up reset circuit is preferably implemented within a computer system having a microprocessor, a memory, and input/output devices coupled together by a system bus. In the preferred embodiment the power-up reset circuit is located within the microprocessor. As power is applied to the system, a reset pulse is applied to the microprocessor ensuring that the microprocessor powers-up in a known state.

DETAILED DESCRIPTION OF THE INVENTION

Figure 1:
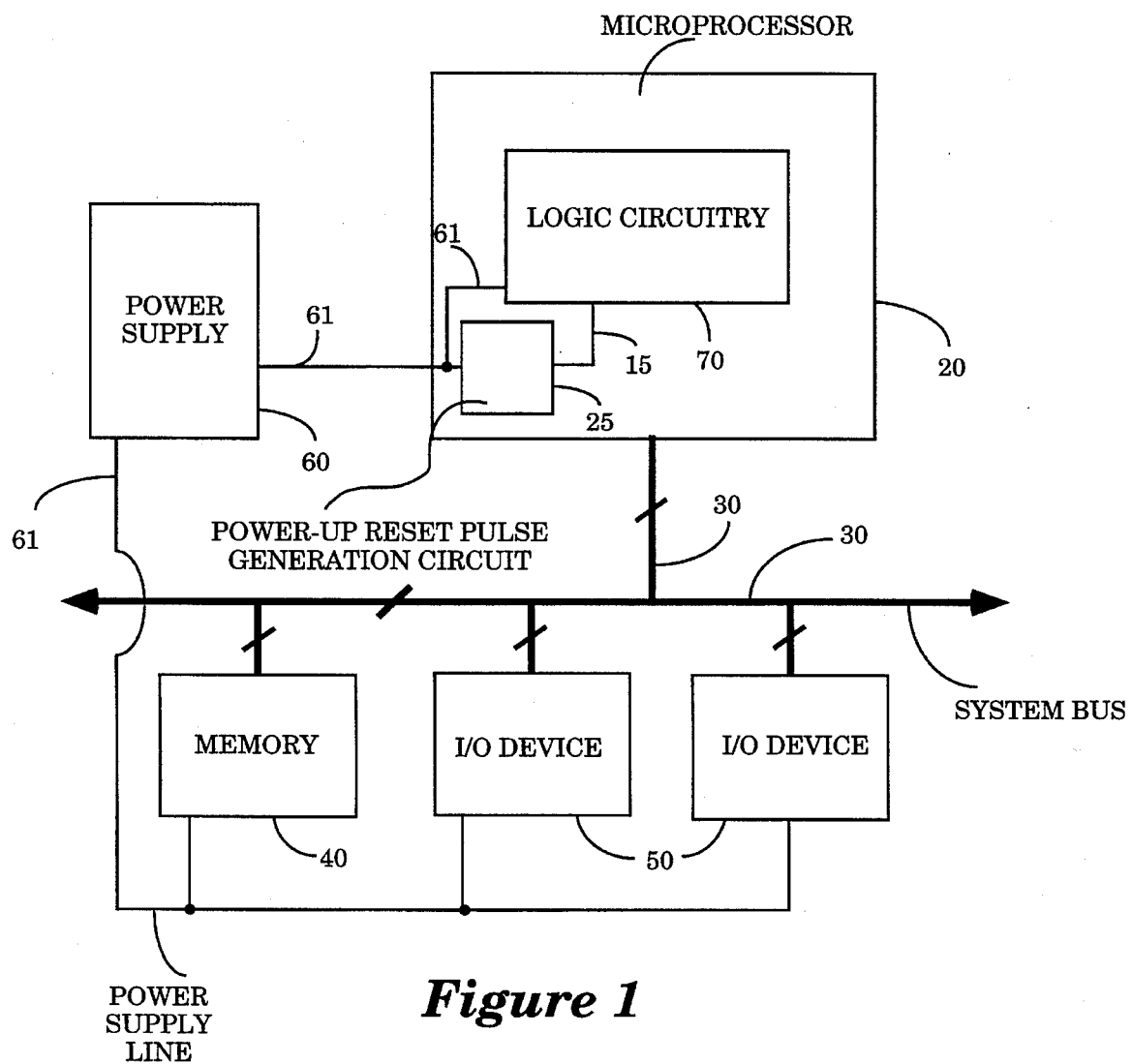
FIG. 1 is a block diagram of a computer system configured in accordance with a preferred embodiment of the invention.

FIG. 1 is a block diagram of a computer system configured in accordance with a preferred embodiment of the invention. The computer system includes a microprocessor 20, a system bus 30, memory 40, and various input/output devices 50. A power supply 60 provides power to each of a various components of the system including microprocessor 20 along power supply lines 61. Within microprocessor 20, the power supply is applied to a power-up reset pulse generation circuit 25, as well as to remaining logic circuitry 70. When the power supply is first activated, power-up reset pulse generation circuit 25 provides a power-up reset pulse to logic circuitry 70 through line 15.

Figure 2:
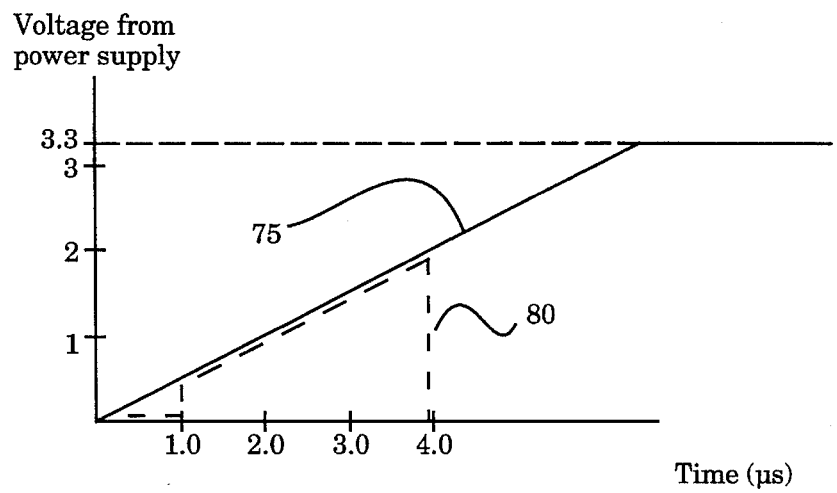
FIG. 2 is a graph of a power-up reset pulse generation circuit used in a first preferred embodiment of the invention.

FIG. 2 is a graph of a voltage level 75 associated with a power supply being activated and a preferred reset pulse 80. The vertical axis represents the voltage level of the power supply, and the horizontal axis represents time in microseconds ("μs"). As the power supply voltage 75 reaches 1.0 Volt ("V") at approximately 1.4 μs, circuitry within power-up reset pulse generation circuit 25 turns on and the voltage level of the reset pulse 80 rises to 1.0 V. The voltage level of reset pulse 80 then continues to rise in a substantially identical manner to power supply voltage level 70 until both signals reach 2.2 V at approximately 4 μs. The reset pulse then deasserts falling back to zero as the voltage level of the power supply continues to rise to 3.3 Volts, which is the voltage level used during normal operation of microprocessor 20 in the representative embodiment. The time periods shown are demonstrative and will vary with the rate of voltage increase for a particular power supply.

Figure 3:
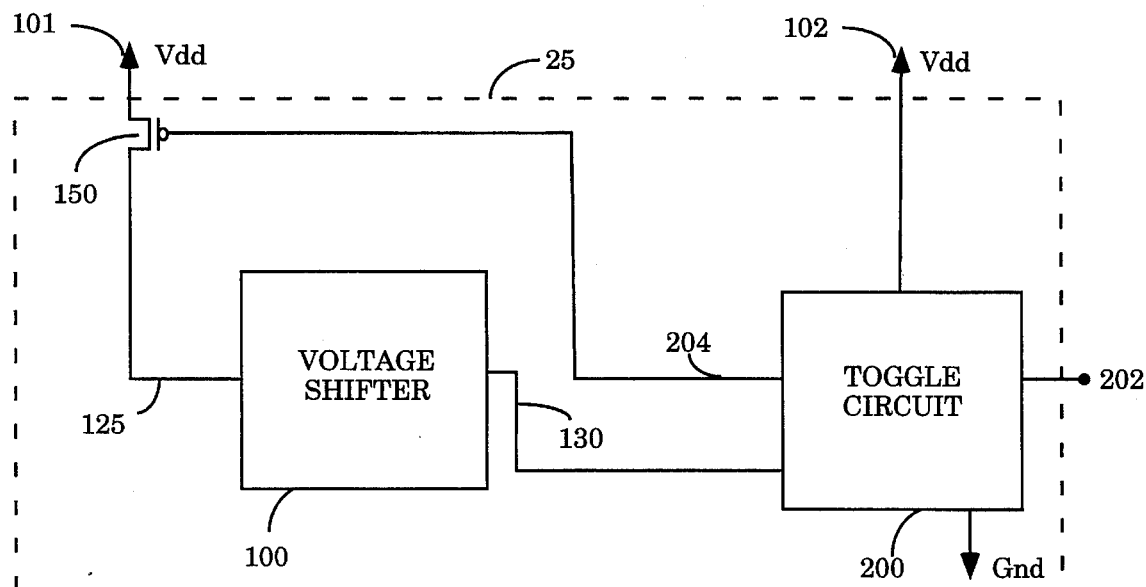
FIG. 3 is a block diagram of a power-up reset pulse generation circuit used in the first preferred embodiment of the invention.

FIG. 3 is a block diagram of power-up reset pulse generation circuit 25. Toggle circuit 200 is configured to power-up in a known state with node 202 in a logic high and node 204 in a logic low. Additionally, toggle circuit 200 is configured to keep node 202 and node 204 in logically opposite states. Voltage shifter 100 creates a voltage drop from node 125 to node 130 of 1.2 V. Generation of the reset pulse begins when the rising voltage level from the power supply asserted at nodes 101 and 102 reaches 1.0 volt. This causes circuitry within toggle circuit 200 to turn on and for node 202 and node 204 to become logic high and logic low respectively. The logic high on node 202 provides the source of the power-up reset pulse and is distributed to other nodes within logic circuitry 70 so that they will be in a known state during power-up. The pulse will have the desired linearly rising shape because its source is the voltage level from the power supply which itself has the desired linearly rising shape. The logic low on node 204 causes the rising voltage level at node 101 to be transmitted to node 125 by turning on p-channel transistor 150.

Simultaneous with toggle circuit 200 powering up in a known state, the rising voltage level at node 101 is applied through p-channel transistor 150 to voltage shifter 100 at node 125. The 1.2 V drop across voltage shifter 100 places node 130 at 1.0 V when node 125 is 2.2 V. This 1.0 toggle signal at node 130 is sufficient to cause toggle circuit 200 to toggle placing node 202 in a logic low state. Because node 202 is the source of the reset pulse, placing node 202 logic low causes the reset pulse to fall to zero volts. The result is reset pulse 75 shown in FIG. 2.

Toggling toggle circuit 200 also causes node 204 to become logic high. This logic high disconnects the power supply from voltage shifter 100 by turning off p-channel transistor 150. Disconnecting the power supply from voltage shifter 100 eliminates any DC current paths through voltage shifter 100 that could cause power-up reset pulse generation circuit 25 to leak DC current after generation of the reset pulse is complete. Additionally, turning off p-channel transistor 150 causes the toggle signal from voltage shifter 100 to deassert by removing the power supply voltage at node 125. This deassertion is caused by device 109.

Figure 4:
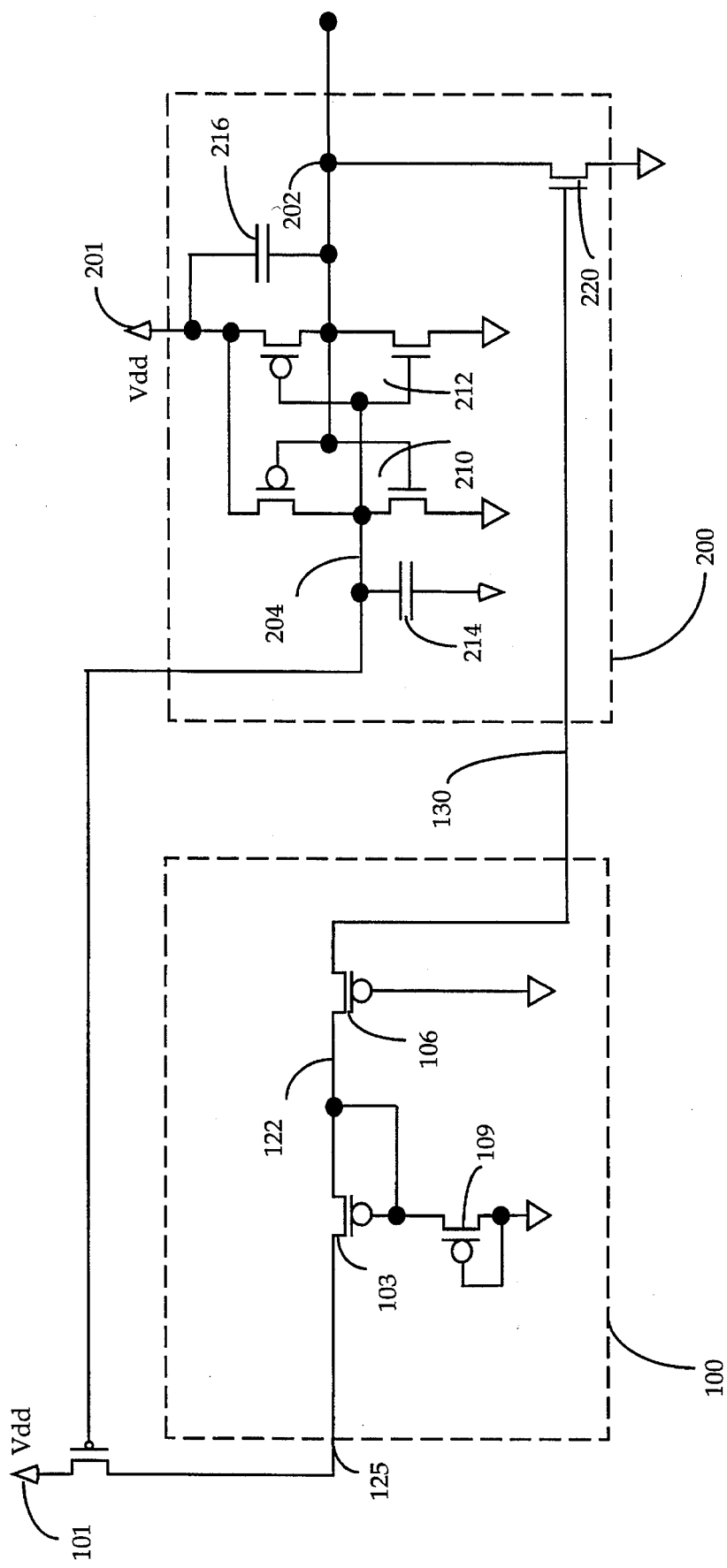
FIG. 4 is a circuit diagram of the power-up reset pulse generation circuit used in a first preferred embodiment of the invention.

FIG. 4 is a circuit diagram of a first preferred embodiment of the power-up reset pulse generation circuit 25. The dashed boxes indicate the circuitry used to implement voltage shifter 100 and toggle circuit 200 which are coupled together as shown in FIG. 3.

Toggle circuit 200 is comprised of inverters 210 and 212, capacitors 214 and 216, and n-channel transistor 220. Inverters 210 and 212 are configured to form a flip-flop with output nodes 202 and 204. Capacitor 216 is coupled between node 202 and node 201, and capacitor 214 is coupled between node 204 and ground. N-channel transistor 220 is coupled between node 202 and ground. As the voltage level from the power supply at node 201 rises, capacitor 216 creates a capacitive coupling between node 202 and node 201 that forces node 202 to power-up logic high. The logic high at node 202 provides the source of the power-up reset pulse. Capacitor 214 creates a capacitive coupling between node 204 and ground. This capacitive coupling causes node 204 to power-up logic low. This logic low turns on p-transistor 150 coupling the power supply at node 101 to voltage shifter 100.

Voltage shifter 100 is comprised of three p-channel transistors 103, 106 and 109. P-channel transistors 103 and 106 have source and drains coupled together at node 122. The gate of p-channel transistor 103 and the source of p-channel transistor 109 are also coupled to node 122. The gate and drain of p-channel transistor 109, as well as the gate of transistor 106, are coupled to ground. This configuration causes p-channel transistors 103 and 106 to create a p-threshold voltage drop from their source to their drains. The rising voltage level from the power supply at node 125 is applied to the source of p-channel transistor 103.

As the voltage level from the power supply rises, p-channel transistor 103 causes node 122 to follow a voltage level one 0.6 V p-threshold below that of node 125. P-channel transistor 106 causes a second 0.6 V p-threshold drop from node 122 to node 130. The resulting 1.2 V difference causes a 1.0 V toggle signal to be asserted from node 130 only when the voltage level at node 125 reaches 2.2 V. This 1.0 V toggle signal is sufficient to turn on n-channel transistor 220 which causes the flip-flop comprised of invertors 210 and 212 to toggle by coupling node 202 to ground. Since node 202 is the source of the reset pulse, toggling the flip-flop and placing node 202 logic low terminates the reset pulse.

Toggling the flip-flop comprised of inverters 210 and 212 also places node 204 logic high. This logic high to turns p-channel transistor 150 off disconnecting the voltage shifter 100 from the power supply. Disconnecting the power supply from voltage shifter 100 eliminates any DC current leakage through voltage supply conversion and driver circuit 25. Additionally, turning off p-channel transistor 150 deasserts the toggle signal at node 130 by removing the power supply voltage from node 125 plus the operation of device 109. Because the logic low and logic high on node 202 and 204 respectively are latched in by the flip-flop comprised of inverters 210 and 212, the circuit will remain in this state until the power supply is deactivated.

P-channel transistor 103 and 106 are configured, in combination with p-channel transistor 109, to counter-act the effect of process and temperature parameter changes on voltage shifter 100. P-channel transistors 103 and 106 are configured with larger feature sizes which make them process insensitive. If the manufacturing process for the circuit is "faster" than normal, the voltage drop across transistors 103 and 106 will become smaller. P-transistor 109 is configured with smaller feature sizes making it process sensitive, which causes it to counter-act the reduced voltage drop by increasing the amount of current it removes from node 122 as the processing environment becomes faster. The result is that the input signal at node 125 must rise to a higher voltage level for a fast process circuit than a slow process circuit. Thus, the voltage level across voltage shifter 100 remains relatively constant regardless of process and temperature parameters. This allows power-up reset pulse generation circuit 25 to more consistently deassert the reset pulse at 2.2 volts, rather than at some other unknown voltage level.

Figure 5:
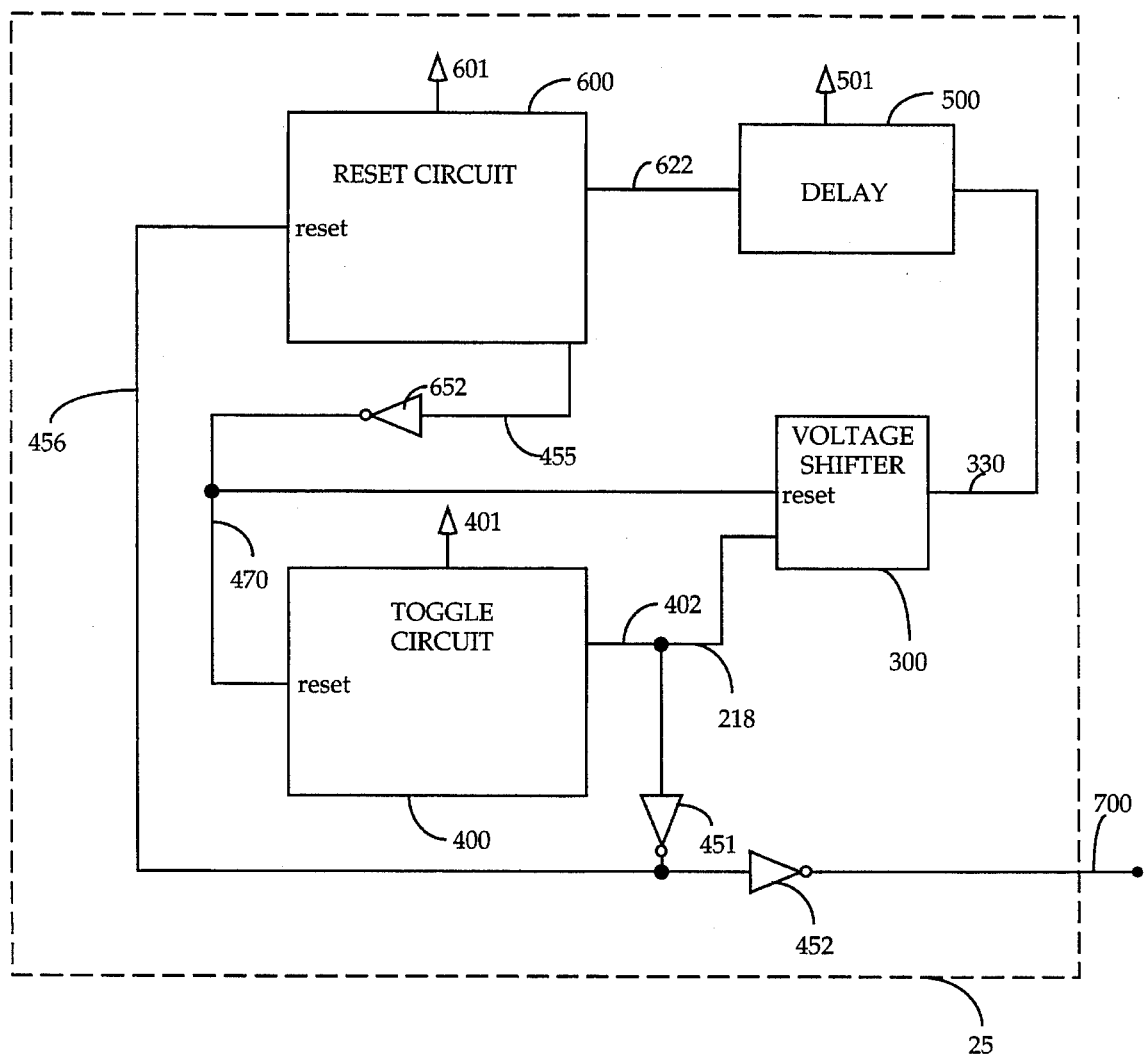
FIG. 5 is a block diagram of the power-up reset pulse generation circuit used in the second preferred embodiment of the invention.

FIG. 5 is a block diagram of power-up reset pulse generation circuit 25 incorporated in the second preferred embodiment of the invention. Voltage shifter 300 is coupled to node 402 of toggle circuit 400. Delay circuit 500 is coupled to output node 330 of voltage shifter 300 and to node 622 of reset circuit 600. Toggle circuit 400 is coupled to reset circuit 600 through lines 455 and 456. Generation of the reset pulse begins when the rising voltage level from the power supply is applied at nodes 401, 501, and 601, as well as to inverters 641, 452, and 650. The rising voltage level from the power supply powers-up toggle circuit 400 with node 402 logic high. The logic high at node 402 provides the source of the power-up reset pulse which, after being transmitted through inverters 451 and 452, is asserted from node 700. The voltage levels on node 402 and node 700 are substantially identical to that of the power supply signal since toggle circuit 200 and inverter 452 are powered by the rising voltage level of the power supply.

Voltage shifter 300 senses the voltage level on node 402 and asserts a toggle signal of 1.0 volt on node 330 when that voltage level reaches 2.2 volts. This toggle signal is transmitted by delay circuit 500 to node 622 where it toggles reset circuit 600 placing node 455 in a logic low state. The logic low on node 455 causes inverter 650 to place a logic high on node 470 which resets toggle circuit 400 and voltage shifter 300. Resetting toggle circuit 400 causes node 402 to become logic low which, after being transmitted through inverters 451 and 452, terminates the reset pulse at node 700. Resetting toggle circuit 400 and voltage shifter 300 also removes excess current from within the two circuits so that the events will be ready to generate another reset pulse should the voltage level from the power supply be removed and then reapplied in a short period of time. Removing excess current from voltage shifter 300 and toggle circuit 400 also removes the toggle signal from node 330.

The logic high on node 456 created by the logic low on node 402 resets reset circuit 600. This allows reset circuit 600 to operate properly should the voltage level from the power supply be removed and then reasserted in a short period of time. After both are reset, toggle circuit 400 and reset circuit 600 form a feedback loop that keeps the two circuits in the reset state until the power supply is deactivated. Delay circuit 500 provides a sufficient delay, between the application of the toggle signal at node 622 when the power supply voltage level is 2.2 V and the removal of the toggle pulse when voltage shifter 300 is reset, so a feedback loop between toggle circuit 400 and reset circuit 600 is established.

Figure 6:
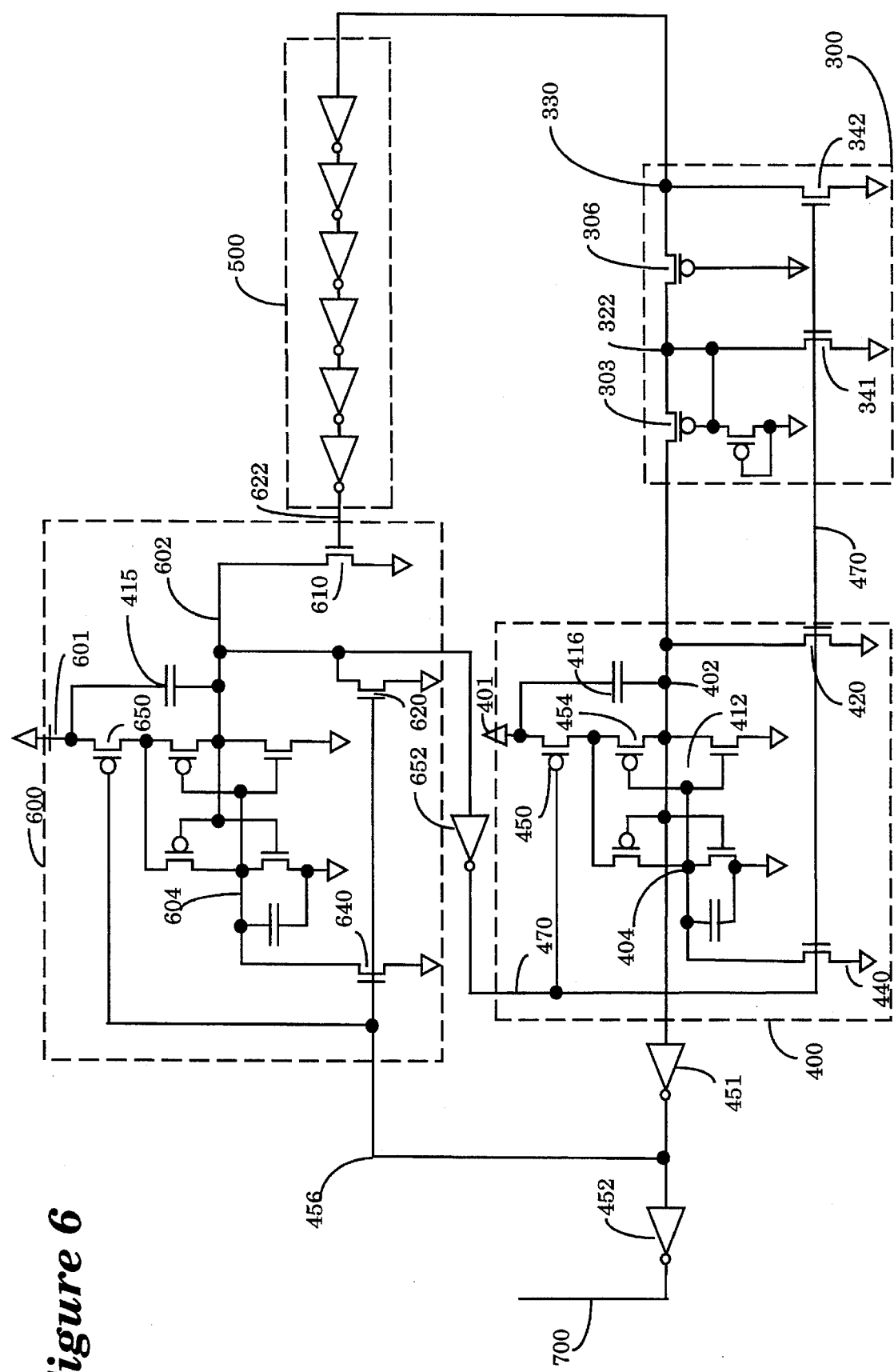
FIG. 6 is a circuit diagram of the power-up reset pulse generation circuit used in the second preferred embodiment of the invention.

FIG. 6 is a circuit diagram of the power-up reset pulse generation circuit utilized in the second preferred embodiment of the invention. The dashed boxes indicate the circuitry used to implement toggle circuit 400, voltage shifter 300, delay circuit 500, and reset circuit 600. The coupling shown between these circuits is the same as that shown in FIG. 5, although line 470 is shown passing through toggle circuit 400 for ease of drawing.

Toggle circuit 400 is implemented with substantially the same circuitry as toggle circuit 200 shown and described in FIG. 4, except for the addition of p-channel transistor 450 and n-channel transistor 440. P-channel transistor 450 is coupled between the power supply at node 401 and the source of p-channel transistor 454. N-channel transistor 440 is coupled to ground and to node 404. Transistors 440 and 450 add reset capability to toggle circuit 400 not present in toggle circuit 200 of FIG. 4. Reset circuit 600 is identical to toggle circuit 400 except for the addition of n-channel transistor 610 which is coupled between ground and node 602. Transistor 610 allows the toggle signal transmitted through delay circuit 500 to cause reset circuit 600 to toggle. Voltage shifter 300 is identical to voltage shifter 100, except for the addition of n-channel transistors 341 and 342 coupled between nodes 322 and 330 respectively and ground. These transistors add reset capability to voltage shifter 300 not present in voltage shifter 100 of FIG. 4. Delay circuit 500 is comprised of six inverters and its output is coupled to the gates of n-channel transistor 610.

The circuit shown in FIG. 6 begins to generate the power-up reset pulse when the rising voltage level from the power supply is applied to nodes 401 and 601, to inverters 451 and 452, and to the inverters within delay circuit 500. Similarly to the manner by which capacitor 216 operates within toggle circuit 200 of FIG. 3, capacitor 416 forces node 402 to a logic high as toggle circuit 400 is powered up. The logic high on node 402 provides the source of the reset pulse at node 700 after being transmitted by inverters 451 and 452. The pulse will have the desired linearly rising voltage level because inverter 452 is powered by the rising voltage level of the power supply which itself has the desired linearly rising voltage level.

The rising voltage level from the power supply at node 402 is coupled by p-channel transistors 450 and 454, as well as by capacitor 416, to node 402 where the rising voltage level is applied to voltage shifter 300. As described above with regard to voltage shifter 100, voltage shifter 300 creates a 1.2 volt drop from node 402 to node 330 so that a toggle signal of 1 volt is asserted at node 330 when the voltage level at node 402 reaches 2.2 volts. The toggle signal is transmitted by delay circuit 500 to reset circuit 600 where the toggle signal causes reset circuit 600 to toggle by pulling node 602 to a logic low using transistor 610. The logic low on node 602 is then transmitted by inverter 652 as a logic high on node 470 where it turns on n-channel transistor 420. Turning on n-channel transistor 420 couples node 402 to ground placing it in a logic low state. Since node 402 is the source of the reset pulse, placing node 402 in a low state terminates the reset pulse at node 700.

The logic high on node 470 also causes toggle circuit 400 and voltage shifter 300 to reset by turning on transistors 440, 341 and 342. Turning on these transistors removes any excess current from nodes 404, 322, and 330 respectively by coupling them to ground, placing voltage shifter 300 and toggle circuit 400 in condition to operate properly should the power supply be removed and reapplied quickly. Coupling node 330 to ground also removes the toggle signal on node 330. The logic high on node 470 also causes p-channel transistor 450 to be turned off decoupling the rest of toggle circuit 400 and voltage shifter 300 from the power supply. This prevents any DC current leakage from occurring through toggle circuit 400.

The logic low on node 402, in addition to terminating the reset pulse, resets reset circuit 600 by placing a logic high on node 456 and turning on n-channel transistors 640 and 620. Turning on n-channel transistors 640 and 620, couples nodes 604 and 602 to ground removing any excess current. This places the reset circuit 600 in proper condition to power-up properly should power be removed and reasserted in a short period of time. The logic high on node 456 also prevents any DC current leakage through reset circuit by turning off p-channel transistors 650 and decoupling reset circuit 600 from the power supply.

Once toggle circuit 400 and reset circuit 600 have both been reset a feedback loop is formed through nodes 602, 470, 402, and 456 that keeps the two circuits reset even after the toggle signal at node 622 is removed. Delay circuit 500 allows this feedback loop to be established by transmitting the signal at node 330 through six inverters before applying the signal to node 622. The feedback loop then locks the two circuits in the reset state so that no DC current leakage occurs within power-up reset pulse generation circuit 25, the power-up reset pulse at node 700 remains logic low until the power supply deactivated, and the circuit remains ready to generate another reset pulse even if the power be removed and reapplied in a short period of time.

Thus a second embodiment of a power-up reset circuit generation circuit has been described. When incorporated within a microprocessor, the circuit generates a power-up reset pulse that ensures the orderly power-up of the microprocessor. Both the first and second embodiments described herein leak substantially no DC current once the power-up cycle has been completed and are designed to be less sensitive to process and environmental changes than power-up reset events of the prior art. The second embodiment also includes a reset function that allows it to function properly even when the power supply is removed and reapplied within a short period of time. Many variations may be made in the embodiments set forth above consistent with the principles of the invention.

What is claimed:

1. A power-up reset circuit comprising:

a toggle circuit formed by CMOS transistors, coupled to a power supply, assuming a first state in response to an activation of the power supply and outputting a first voltage on a first line; a voltage shifter circuit, coupled to the first line, formed by a first P-channel transistor that operates as a first voltage dropping diode, a second P-channel transistor connected in series with the first P-channel transistor, and a third P-channel transistor connected between the first P-Channel transistor and the second P-channel transistor that operates as a current removing diode, the voltage shifter circuit assuming the first state in response to receiving the first voltage and dropping the first voltage to a second voltage on a second line; and a reset circuit comprising a flip-flop circuit formed by CMOS transistors, coupled to the voltage shifter circuit via a delay circuit to the second line, assuming the first state and outputting a signal to reset the toggle circuit and the voltage shifter circuit to a second state in response to the second voltage such that each of the first and second lines are driven to a reference voltage, wherein the reference voltage at the first line also resets the reset circuit to said second state.

2. A computer system comprising:

(A) a power supply that supplies power to the computer system;

(B) a memory coupled to the power supply;

(C) a microprocessor coupled to the power supply, the microprocessor having (1) a power-up reset circuit comprising a toggle circuit formed by CMOS transistors, coupled to said power supply, assuming a first state in response to an activation of the power supply and outputting a first voltage on a first line, (2) a voltage shifter circuit, coupled to said first line, formed by a first P-channel transistor that operates as a first voltage dropping diode, a second P-channel transistor connected in series with the first P-channel transistor, and a third P-channel transistor connected between the first P-channel transistor and the second P-channel transistor that operates as a current removing diode, the voltage shifter circuit assuming the first state in response to receiving the first voltage and dropping the first voltage to a second voltage on a second line, and (3) a reset circuit comprising a flip-flop circuit formed by CMOS transistors, coupled to the voltage shifter circuit via a delay circuit to the second line, assuming the first state and outputting a signal to reset the toggle circuit and the voltage shifter circuit to a second state in response to the second voltage at the second line such that each of the first and second lines are driven to a reference voltage, wherein the reference voltage at the first line also resets the reset circuit to the second state.

3. The apparatus of claim 1, wherein the toggle circuit comprises a flip-flop circuit and a capacitor coupled to the first line.

4. The computer system of claim 2, wherein the toggle circuit comprises a flip-flop circuit and a capacitor coupled to the first line.

* * * * *